United States Patent
Kuratomi et al.

(10) Patent No.: US 12,347,695 B2
(45) Date of Patent: Jul. 1, 2025

(54) METHODS FOR CONTROLLING CONTACT RESISTANCE IN COBALT-TITANIUM STRUCTURES

(71) Applicant: APPLIED MATERIALS, INC., Santa Clara, CA (US)

(72) Inventors: Takashi Kuratomi, San Jose, CA (US); Avgerinos Gelatos, Scotts Valley, CA (US); Tae Hong Ha, San Jose, CA (US); Xuesong Lu, San Jose, CA (US); Szuheng Ho, Sunnyvale, CA (US); Wei Lei, Campbell, CA (US); Mark Lee, Mountain View, CA (US); Raymond Hung, Palo Alto, CA (US); Xianmin Tang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 554 days.

(21) Appl. No.: 17/857,381

(22) Filed: Jul. 5, 2022

(65) Prior Publication Data

US 2022/0336227 A1    Oct. 20, 2022

Related U.S. Application Data

(62) Division of application No. 16/590,755, filed on Oct. 2, 2019, now Pat. No. 11,424,132.

(Continued)

(51) Int. Cl.
*H01L 21/3205* (2006.01)
*C23C 14/06* (2006.01)
*C23C 16/02* (2006.01)
*C23C 16/06* (2006.01)
*C23C 16/34* (2006.01)
(Continued)

(52) U.S. Cl.
CPC .... *H01L 21/32051* (2013.01); *C23C 14/0641* (2013.01); *C23C 16/0227* (2013.01); *C23C 16/06* (2013.01); *C23C 16/34* (2013.01); *C23C 16/45525* (2013.01); *C23C 16/56* (2013.01); *H01L 21/02186* (2013.01); *H01L 21/0228* (2013.01); *H01L 21/02337* (2013.01); *H01L 21/2855* (2013.01); *H01L 21/28556* (2013.01); *H01L 21/321* (2013.01); *H01L 21/76895* (2013.01)

(58) Field of Classification Search
None
See application file for complete search history.

(56) References Cited

U.S. PATENT DOCUMENTS 5,047,367 A    9/1991 Wei et al.
5,308,655 A    5/1994 Eichman et al.
(Continued)

OTHER PUBLICATIONS

International Search Report for PCT/US2019/058461, dated Feb. 18, 2020.

*Primary Examiner* — Erik T. K. Peterson
(74) *Attorney, Agent, or Firm* — Moser Taboada

(57) ABSTRACT

Methods for producing a reduced contact resistance for cobalt-titanium structures. In some embodiments, a method comprises depositing a titanium layer using a chemical vapor deposition (CVD) process, depositing a first cobalt layer on the titanium nitride layer using a physical vapor deposition (PVD) process, and depositing a second cobalt layer on the first cobalt layer using a CVD process.

13 Claims, 3 Drawing Sheets

Related U.S. Application Data

(60) Provisional application No. 62/755,438, filed on Nov. 3, 2018.

(51) Int. Cl.
| | |
|---|---|
| *C23C 16/455* | (2006.01) |
| *C23C 16/56* | (2006.01) |
| *H01L 21/02* | (2006.01) |
| *H01L 21/285* | (2006.01) |
| *H01L 21/321* | (2006.01) |
| *H01L 21/768* | (2006.01) |

(56) References Cited

U.S. PATENT DOCUMENTS

| | | |
|---|---|---|
| 5,962,084 A | 10/1999 | Miyamoto et al. |
| 6,051,281 A | 4/2000 | Kobayashi et al. |
| 6,365,516 B1 | 4/2002 | Frenkel et al. |
| 6,436,820 B1 | 8/2002 | Hu et al. |
| 9,966,275 B2 | 5/2018 | Biggs et al. |
| 10,529,663 B1 | 1/2020 | Nogami et al. |
| 2002/0132056 A1 | 9/2002 | Montano et al. |
| 2003/0064578 A1 | 4/2003 | Nakamura et al. |
| 2003/0147075 A1 | 8/2003 | Otsuki et al. |
| 2004/0043601 A1 | 3/2004 | Park et al. |
| 2004/0082168 A1 | 4/2004 | Lee et al. |
| 2005/0233093 A1 | 10/2005 | Tada et al. |
| 2006/0110533 A1 | 5/2006 | Hwang et al. |
| 2007/0202254 A1 | 8/2007 | Ganguli et al. |
| 2008/0085611 A1 | 4/2008 | Khandelwal et al. |
| 2008/0268635 A1 | 10/2008 | Yu et al. |
| 2009/0004850 A1 | 1/2009 | Ganguli et al. |
| 2009/0142474 A1 | 6/2009 | Gandikota et al. |
| 2010/0273013 A1 | 10/2010 | Jin et al. |
| 2012/0252207 A1 | 10/2012 | Lei et al. |
| 2014/0183738 A1 | 7/2014 | Jezewski et al. |
| 2014/0273428 A1 | 9/2014 | Shero et al. |
| 2014/0273470 A1 | 9/2014 | Lin et al. |
| 2015/0079784 A1 | 3/2015 | Zope et al. |
| 2015/0093891 A1 | 4/2015 | Zope et al. |
| 2015/0140233 A1 | 5/2015 | Zope et al. |
| 2016/0247718 A1 | 8/2016 | Zope et al. |
| 2017/0032973 A1 | 2/2017 | Baum et al. |
| 2017/0033048 A1 | 2/2017 | Kim et al. |
| 2018/0158686 A1* | 6/2018 | Gelatos ............ H01L 21/76843 |
| 2018/0211872 A1 | 7/2018 | Wu et al. |
| 2018/0308702 A1* | 10/2018 | Chou ............... H01L 21/76865 |
| 2019/0273042 A1 | 9/2019 | Cheng et al. |
| 2020/0135558 A1 | 4/2020 | Standaert et al. |
| 2020/0006055 A1 | 8/2020 | Chen et al. |

* cited by examiner

METHODS FOR CONTROLLING CONTACT RESISTANCE IN COBALT-TITANIUM STRUCTURES

CROSS-REFERENCE TO RELATED APPLICATIONS

This application is a divisional of co-pending U.S. patent application Ser. No. 16/590,755, filed Oct. 2, 2019, which claims benefit of U.S. provisional patent application Ser. No. 62/755,438, filed Nov. 3, 2018, all of which are herein incorporated by reference in its entirety.

FIELD

Embodiments of the present principles generally relate to semiconductor processing.

BACKGROUND

When semiconductors are formed, different conductive materials are often used in the circuits. The junction point, or contact area, between the different conductive materials have an impeding effect on electrons traveling through the contact area. The impeding effect is generally known as contact resistance. The size of semiconductors is continually growing smaller to allow more circuits in the same amount of space. As the semiconductor sizes shrink, the contact resistance becomes increasingly important, not only because of the smaller contact sizes but also because of the increasing numbers of contacts in a given semiconductor device. The inventors have observed that the contact resistance of cobalt and titanium materials can be increased due to the continuing miniaturization of circuits found in the semiconductor industry.

Accordingly, the inventors have provided improved methods and apparatus for reducing contact resistance in cobalt-titanium semiconductor structures.

SUMMARY

Methods for reducing contact resistance in cobalt-titanium structures are provided herein.

In some embodiments, a method for forming a cobalt-titanium structure comprises depositing a titanium layer using a chemical vapor deposition (CVD) process, depositing a titanium nitride layer on the titanium layer using an atomic layer deposition (ALD) process, depositing a first cobalt layer on the titanium nitride layer using a physical vapor deposition (PVD) process, and depositing a second cobalt layer on the first cobalt layer using a CVD process.

In some embodiments, the method further comprises reflowing the second cobalt layer using a high temperature PVD process, treating the titanium layer with a nitridation process, wherein the nitridation process is nitrogen and/or hydrogen plasma, and/or an ammonia plasma, and/or ammonia gas soak, treating the titanium layer with the nitrogen and/or hydrogen plasma, and/or an ammonia plasma for a duration of greater than zero to approximately 60 sec and/or the ammonia gas soak for a duration of greater than zero to approximately 240 seconds, treating the titanium layer with a hydrogen soak and/or plasma process before the nitridation process and/or after the nitridation process, treating the titanium nitride layer with a silane gas soak, and/or performing a pre-clean process before depositing the titanium layer.

In some embodiments, a method for forming a cobalt-titanium structure comprises depositing a titanium layer using a chemical vapor deposition (CVD) process, treating the titanium layer with a silane gas soak, depositing a first cobalt layer using a physical vapor deposition (PVD) process, and depositing a second cobalt layer on the first cobalt layer using a CVD process.

In some embodiments, the method further comprises reflowing the second cobalt layer using a high temperature PVD process, treating the titanium layer with a nitridation process, wherein the nitridation process is nitrogen and/or hydrogen plasma, and/or an ammonia plasma, and/or an ammonia gas soak, treating the titanium layer with the nitrogen and/or hydrogen plasma, or an ammonia plasma for a duration of greater than zero to approximately 60 sec and/or the ammonia gas soak for a duration of greater than zero to approximately 240 seconds, treating the titanium layer with a hydrogen soak and/or plasma process before the nitridation process and/or after the nitridation process, and/or performing a pre-clean process before depositing the titanium layer.

In some embodiments, a non-transitory, computer readable medium having instructions stored thereon that, when executed, cause a method for forming a cobalt-titanium structure to be performed, the method comprises depositing a titanium layer using a chemical vapor deposition (CVD) process; depositing a titanium nitride layer on the titanium layer using an atomic layer deposition (ALD) process; depositing a first cobalt layer on the titanium nitride layer using a physical vapor deposition (PVD) process; and depositing a second cobalt layer on the first cobalt layer using a CVD process.

In some embodiments, the non-transitory, computer readable medium may further include reflowing the second cobalt layer using a high temperature PVD process; treating the titanium layer with a nitridation process, treating the titanium nitride layer with a silane gas soak, or performing a pre-clean process before depositing the titanium layer; wherein the nitridation process is nitrogen and/or hydrogen plasma, and/or an ammonia plasma, and/or an ammonia gas soak; and/or treating the titanium layer with the nitrogen and/or hydrogen plasma, and/or an ammonia plasma for a duration of greater than zero to approximately 60 sec and/or the ammonia gas soak for a duration of greater than zero to approximately 240 seconds or treating the titanium layer with a hydrogen soak and/or plasma process before the nitridation process and/or after the nitridation process.

In some embodiments, a structure formed on a silicon substrate comprises a feature with a bottom of amorphous silicon or crystalline silicon and sidewalls of a silicon oxide layer or a silicon nitride layer deposited on the silicon substrate, a titanium silicide layer or TiSiNx layer formed on the amorphous silicon or the crystalline silicon at the bottom of the feature, and a TiSiOx layer or a TiSiN layer formed on the sidewalls of a silicon dioxide material or silicon nitride material, respectively, of the feature, a titanium nitride layer formed directly on the TiSiOx layer or TiSiNx layer on the sidewalls of the feature and on the titanium silicide layer or Ti(Si)N on the bottom of the feature, and a cobalt fill formed in the feature directly on the titanium nitride layer.

In some embodiments, a cluster tool with a common vacuum environment for forming semiconductor structures comprises at least one pre-clean chamber for cleaning a substrate, a plasma enhanced chemical vapor deposition (PE-CVD) chamber for depositing titanium material on the substrate, a CVD deposition chamber for depositing cobalt material on the substrate, and a physical vapor deposition (PVD) chamber for depositing cobalt material on the substrate.

In some embodiments, the cluster tool further comprises wherein the PE-CVD chamber is configured to perform a silane gas soak after a deposition process, an atomic layer deposition (ALD) chamber for depositing titanium nitride material on the substrate, and/or wherein the ALD chamber is configured to perform a silane gas soak after a deposition process.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
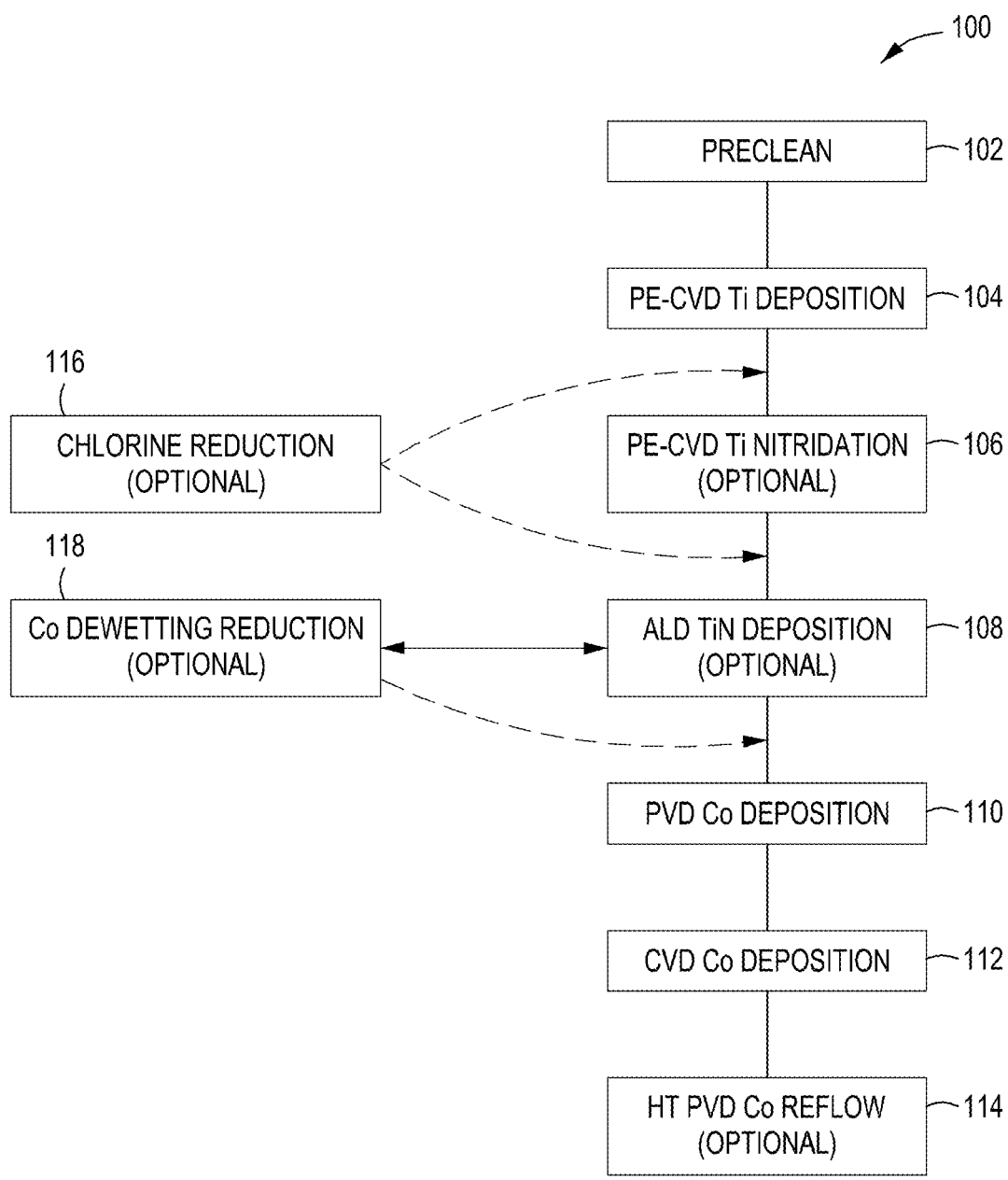
FIG. 1 is a method of forming a cobalt-titanium structure in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide reduced contact resistance between cobalt and titanium based materials used in semiconductor structures. The techniques reduce or eliminate oxidation between layers of the structure, advantageously reducing contact resistance, and improve cobalt material adhesion to the sides of a feature on a substrate. In some embodiments, an integrated pre-clean, titanium (or titanium silicide, $TiSi_x$) material deposition, and cobalt fill process may eliminate film oxidation caused by processes that have a vacuum break between titanium and cobalt fill chambers. The removal of the vacuum break reduces oxidation and contact resistance, $R_c$. Cobalt adhesion is also improved due to improved liner film quality (oxidized liner film causes increased cobalt dewetting). The simplified integrated system improves semiconductor device reliability by replacing fill metal from tungsten to cobalt, optionally eliminating a nitridation step which is required for vacuum break processes to prevent oxidation on titanium, eliminating or reducing oxidation, maximizing cobalt volume by eliminating $TiSiON_x$ formation on sidewalls of a feature caused by the vacuum break, improving atomic layer deposition (ALD) of titanium nitride film quality, and improving cobalt adhesion on ALD deposited titanium nitride.

Figure 2:
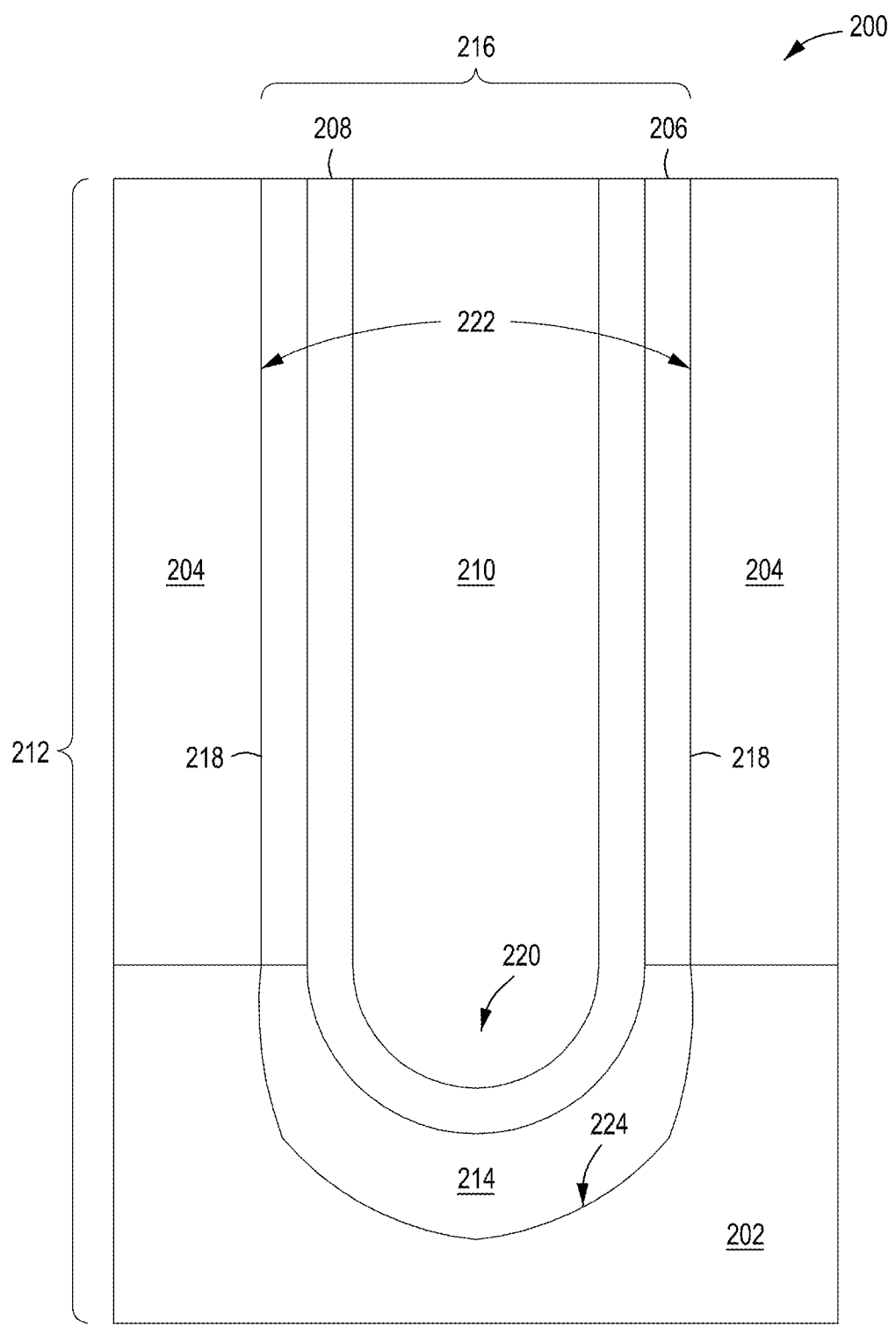
FIG. 2 is a cross-sectional view of a cobalt-titanium structure in accordance with some embodiments of the present principles.

FIG. 1 is a method 100 of forming a cobalt-titanium structure in accordance with some embodiments. FIG. 2 is a cross-sectional view 200 of a cobalt-titanium structure or feature 212 in accordance with some embodiments. The feature 212 of FIG. 2 will be referenced during the discussion of the method 100. In some embodiments, the method 100 begins by pre-cleaning a substrate as indicated in block 102. An opening 216 of the feature 212 may be formed by an etching process or other processes to form sidewalls 218 and a bottom 220. The substrate may comprise a silicon substrate 202 with a dielectric layer 204 deposited at the sidewall. The dielectric layer 204 may comprise a silicon nitride or silicon dioxide material. The pre-cleaning process may include a directional and/or isotropic pre-clean process to remove native oxide, dry etch residue, and contaminates from contact surfaces (e.g., field, sidewall surfaces 222, and/or bottom surface 224 of the opening 216) of the feature 212. A plasma enhanced chemical vapor deposition (PE-CVD) process is then used to deposit titanium (or titanium silicide) material on the bottom surface 224 to form titanium silicide 214, as indicated in block 104. During the PE-CVD titanium (or titanium silicide) deposition process, the process also deposits titanium (or titanium silicide) on the sidewalls 218 and forms a titanium-based layer 206 of TiSiO (on sidewalls 218 where the dielectric layer 204 comprises $SiO_2$ material) or TiSiN (on sidewalls 218 where the dielectric layer 204 comprises SiN material). The inventors have found that the deposition of the titanium material on sidewall easily oxidizes and forms TiSiON which increases in thickness when the wafer is exposed in air (vacuum break). The increased thickness reduces cobalt fill volume which degrades the contact resistance, $R_c$. In addition, the TiSiON film degrades ALD (Atomic Layer Deposition) TiN film quality and degrades cobalt adhesion.

In some embodiments, an optional nitridation step in a PE-CVD titanium chamber is performed for a short duration after the titanium deposition process to reduce/eliminate oxidation of the deposited titanium and prevent the formation of TiSiON as indicated in block 106. The titanium deposition process and the titanium nitridation may be performed in the same chamber. The titanium nitridation is used to treat the titanium to prevent oxidation that may occur during the time the silicon substrate 202 moves between chambers (transfer time) even when the chambers are integrated in a common vacuum environment. After the deposition of titanium, the silicon keeps migrating to the surface to form titanium silicide. Once the silicon reaches the surface, the silicon will interact with nitrogen to form silicon nitride—a dielectric which causes high contact resistance, $R_c$, during the nitridation step and/or a ALD TiN process (described below). The inventors have found that a short duration of nitridation after titanium deposition will prevent the formation of the silicon nitride by forming Ti(Si)N without requiring a thick nitridation layer. The titanium nitridation process may be effective to form thin Ti(Si)N layer which works as a barrier layer to eliminate $TiSi_x$ and cobalt intermixing. The inventors have found that titanium silicon nitride increases contact resistance and should be minimized to reduce the contact resistance. In some embodiments, nitrogen, hydrogen, and argon are flowed into the PE-CVD chamber and then plasma is formed for a duration greater than zero to approximately 60 seconds or less. In some embodiments, the treatment duration is approximately 10 seconds. In some embodiments, the titanium nitridation process may include an ammonium ($NH_3$) gas soak treatment that has a duration of greater than zero to approximately 240 seconds. The ammonium gas soak after Ti deposition forms a Ti(Si)N layer and eliminates silicon migration and silicon nitride formation at ALD titanium nitride deposition processes. The inventors have found that, with the integrated process, the titanium nitridation process of the present techniques may be substantially reduced because the thickness of the treated titanium does not need to be able to prevent oxidation caused during a vacuum break.

In some embodiments, titanium tetrachloride ($TiCl_4$) gas is used in the titanium deposition process and may cause chlorine impurities. The chlorine impurities may be removed by exposure to oxygen during a vacuum break. Without a vacuum break, the chlorine impurities may remain and cause adhesion problems for cobalt during subsequent cobalt deposition processes. An optional chlorine reduction process may be introduced after the PE-CVD titanium deposition process or after the optional PE-CVD titanium nitridation process as indicated by block 116 and the dotted lines. In some embodiments, the optional chlorine reduction process may include a hydrogen gas treatment to reduce/eliminate the chlorine impurities and promote cobalt adhesion during subsequent cobalt deposition processes.

In some embodiments, a titanium nitride layer 208 may be formed by an optional ALD titanium nitride deposition process as indicated in block 108. The titanium nitride layer 208 prevents subsequent cobalt depositions from reacting with titanium and forming a titanium-cobalt alloy which would increase the contact resistance, $R_c$, between the titanium and the cobalt. The inventors have found that the thickness of the ALD deposition has a direct impact on the contact resistance. As features become smaller, elimination of the titanium nitride layer 208 deposited by ALD may allow for an increase in cobalt fill volume. The inventors have found that other processes may be substituted for the optional ALD titanium nitride deposition process as discussed below.

In some embodiments, an optional cobalt dewetting reduction process may be performed after the optional ALD titanium nitride deposition process or in lieu of the optional ALD titanium nitride deposition process as indicated in block 118. The optional cobalt dewetting reduction process enhances cobalt adhesion (reduces cobalt dewetting) to increase cobalt adhesion on the sidewalls on the titanium-based layer 206 or on the titanium nitride layer 208 of the feature 212. In some embodiments, the optional cobalt dewetting reduction process may include, but is not limited to, a silane ($SiH_4$) gas soak treatment. The silane gas soak treatment forms silicon elements which react with the cobalt deposition to increase adhesion. The silane gas soak treatment may be performed in a PE-CVD deposition chamber and/or in an ALD deposition chamber.

In block 110, a physical vapor deposition (PVD) process is used to deposit cobalt to eliminate a cobalt pull-up void at the bottom of the contact. The PVD process is a directional process and the cobalt deposition is mainly on the field and on the bottom 220 of the feature 212. The PVD process produces only a thin layer of deposition on the sidewalls on the titanium-based layer 206 or on the titanium nitride layer 208 of the feature 212. As described above, using the optional cobalt dewetting reduction process promotes adhesion to the sidewalls of the feature 212 with or without a PVD process. In block 112, a CVD process is used to deposit cobalt on the silicon substrate 202. The deposited cobalt is shown in FIG. 2 as a cobalt fill 210. In some embodiments, a high temperature (HT) PVD reflow process is used to reflow the deposited cobalt as indicated in block 114.

Figure 3:
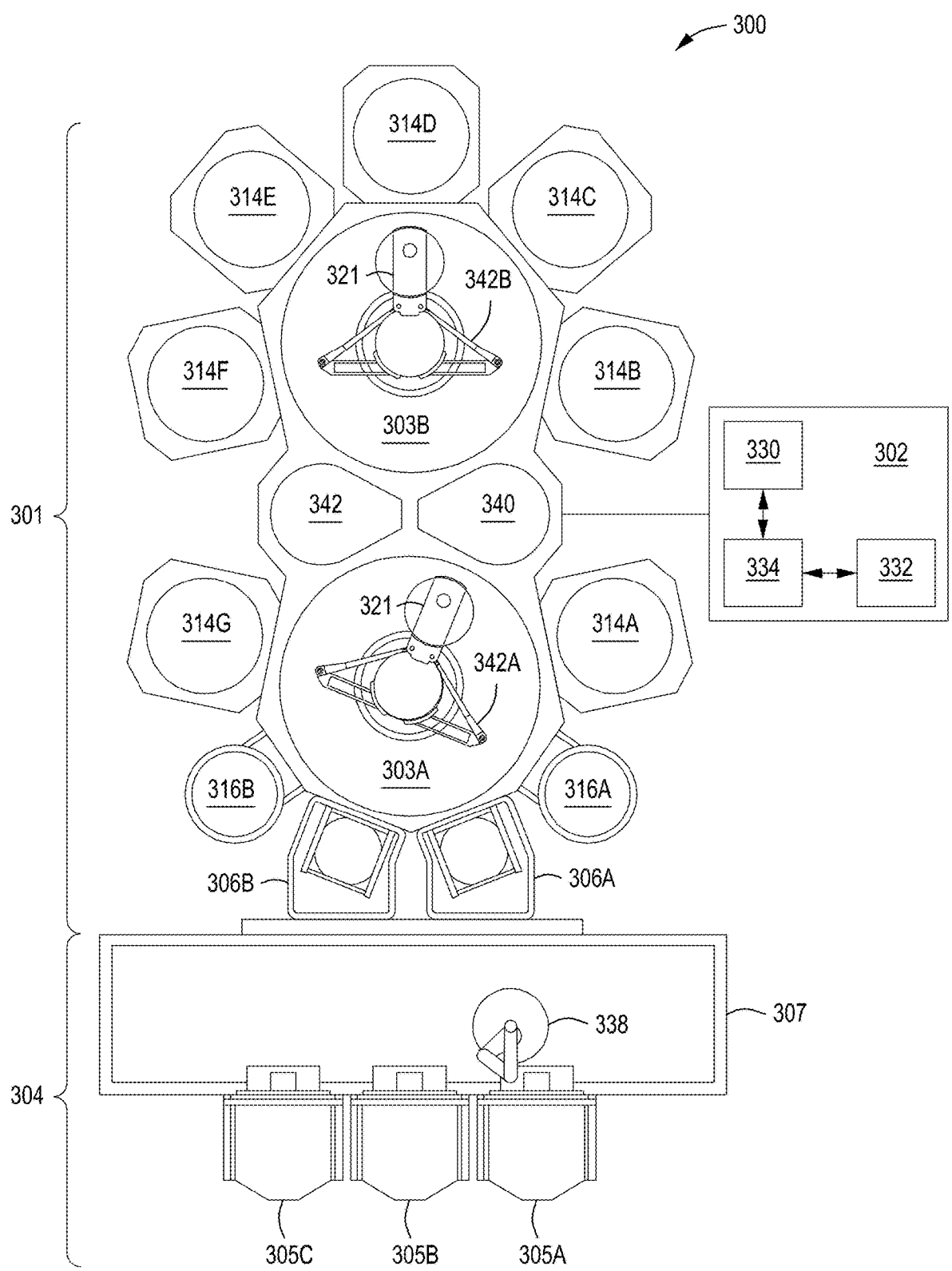
FIG. 3 is a cluster tool which may be used to perform methods to create cobalt-titanium structures in accordance with some embodiments of the present principles.

The methods described herein may be performed in individual process chambers that may be performed in a cluster tool (e.g., in situ RTP processing), for example, an integrated tool 300 (i.e., cluster tool) described below with respect to FIG. 3. The advantage of using an integrated tool 300 is that there is no vacuum break and no substantial process lag between depositions and treatments. Examples of the integrated tool 300 include the ENDURA® integrated tools, available from Applied Materials, Inc., of Santa Clara, California. However, the methods described herein may be practiced using other cluster tools having suitable process chambers, or in other suitable process chambers. For example, in some embodiments the inventive methods discussed above may advantageously be performed in an integrated tool such that there are no vacuum breaks between processes. For example, the elimination of vacuum breaks may limit or prevent contamination (oxidation) of the substrate between processes.

The integrated tool 300 includes a vacuum-tight processing platform 301, a factory interface 304, and a system controller 302. The processing platform 301 comprises multiple processing chambers, such as 314A, 314B, 314C, 314D, 314E, 314F, and 314G operatively coupled to a vacuum substrate transfer chamber (transfer chambers 303A, 303B). The factory interface 304 is operatively coupled to the transfer chamber 303A by one or more load lock chambers (two load lock chambers, such as 306A and 306B shown in FIG. 3).

In some embodiments, the factory interface 304 comprises at least one docking station 307, at least one factory interface robot 338 to facilitate the transfer of the semiconductor substrates. The docking station 307 is configured to accept one or more front opening unified pod (FOUP). Three FOUPS, such as 305A, 305B, and 305C are shown in the embodiment of FIG. 3. The factory interface robot 338 is configured to transfer the substrates from the factory interface 304 to the processing platform 301 through the load lock chambers, such as 306A and 306B. Each of the load lock chambers 306A and 306B have a first port coupled to the factory interface 304 and a second port coupled to the transfer chamber 303A. The load lock chamber 306A and 306B are coupled to a pressure control system (not shown) which pumps down and vents the load lock chambers 306A and 306B to facilitate passing the substrates between the vacuum environment of the transfer chamber 303A and the substantially ambient (e.g., atmospheric) environment of the factory interface 304. The transfer chambers 303A, 303B have vacuum robots 342A, 342B disposed in the respective transfer chambers 303A, 303B. The vacuum robot 342A is capable of transferring substrates 321 between the load lock chamber 306A, 306B, the processing chambers 314A and 314G and a cooldown station 340 or a pre-clean station 342. The vacuum robot 342B is capable of transferring substrates 321 between the cooldown station 340 or pre-clean station 342 and the processing chambers 314B, 314C, 314D, 314E, and 314F.

In some embodiments, the processing chambers 314A, 314B, 314C, 314D, 314E, 314F, and 314G are coupled to the transfer chambers 303A, 303B. The processing chambers 314A, 314B, 314C, 314D, 314E, 314F, and 314G may comprise an isotropic pre-clean chamber, a directional pre-clean chamber, a PE-CVD chamber for titanium or $TiSi_x$ depositions (with or without a cobalt dewetting reduction process capability such as, but not limited to, a silane gas soak capability), an optional ALD chamber (with or without a cobalt dewetting reduction process capability such as, but not limited to, a silane gas soak capability), a CVD chamber for cobalt deposition, a PVD chamber for cobalt deposition, and/or an optional HT PVD chamber for cobalt reflow. The process chambers may include any chambers suitable to perform all or portions of the methods described herein, as discussed above.

In some embodiments, one or more optional service chambers (shown as 316A and 316B) may be coupled to the transfer chamber 303A. The service chambers 316A and 316B may be configured to perform other substrate processes, such as degassing, orientation, substrate metrology, cool down, and the like.

The system controller 302 controls the operation of the tool 300 using a direct control of the process chambers 314A, 314B, 314C, 314D, 314E, 314F, and 314G or alternatively, by controlling the computers (or controllers) associated with the process chambers 314A, 314B, 314C, 314D, 314E, 314F, and 314G and the tool 300. In operation, the system controller 302 enables data collection and feedback from the respective chambers and systems to optimize performance of the tool 300. The system controller 302 generally includes a Central Processing Unit (CPU) 330, a memory 334, and a support circuit 332. The CPU 330 may be any form of a general purpose computer processor that can be used in an industrial setting. The support circuit 332 is conventionally coupled to the CPU 330 and may comprise a cache, clock circuits, input/output subsystems, power supplies, and the like. Software routines, such as a method as described above may be stored in the memory 334 and, when executed by the CPU 330, transform the CPU 330 into a specific purpose computer (system controller 302). The software routines may also be stored and/or executed by a second controller (not shown) that is located remotely from the tool 300.

The memory 334 is in the form of computer-readable storage media that contains instructions, when executed by the CPU 330, to facilitate the operation of the semiconductor processes and equipment. The instructions in the memory 334 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method for forming a cobalt-titanium structure with a reduced contact resistance, comprising:

etching an opening into a substrate to form a feature with sidewalls and a bottom in the substrate, wherein the substrate is a silicon material with a layer of a dielectric material on an uppermost surface of the substrate and wherein the sidewalls are formed from the dielectric material and the bottom extends into the substrate and is formed into the silicon material;

depositing a titanium layer onto the feature using a plasma-enhanced chemical vapor deposition (PE-CVD) process in a PE-CVD titanium deposition chamber using titanium-chloride-based gas to form a titanium silicide layer directly on the bottom of the feature and to form a titanium silicon oxide first layer when the dielectric material is a silicon dioxide dielectric material or a titanium silicon nitride first layer when the dielectric material is a silicon nitride dielectric material directly on the sidewalls of the feature;

treating the feature with a nitridation process with a duration of approximately four minutes or less in the PE-CVD titanium deposition chamber to form a titanium silicon nitride second layer on the feature, wherein the titanium silicon nitride second layer prevents formation of silicon nitride on the titanium silicon oxide first layer or the titanium silicon nitride first layer which increases contact resistance and provides a barrier to eliminate formation of $TiSi_x$ on the titanium silicon oxide first layer or on the titanium silicon nitride first layer and subsequent intermixing with a first subsequent cobalt deposition layer;

treating the feature with a chlorine reduction process that reduces chlorine impurities caused by use of the titanium-chloride-based gas in depositing the titanium layer and promotes cobalt adhesion of the first subsequent cobalt deposition layer;

treating the feature with a cobalt dewetting reduction process that increases cobalt adhesion of the first subsequent cobalt deposition layer on the sidewalls of the feature;

depositing the first subsequent cobalt deposition layer directly on the bottom of the feature using a directional physical vapor deposition (PVD) process that prevents voids from forming in the bottom of the feature; and depositing a second subsequent cobalt deposition layer directly on the first subsequent cobalt deposition layer using a CVD process to fill the feature to at least an uppermost surface of the substrate, wherein the feature forms a contact of cobalt and titanium-based material with a reduced contact resistance.

2. The method of claim 1, further comprising:

reflowing the second subsequent cobalt deposition layer using a high temperature process.

3. The method of claim 1, wherein the nitridation process is a nitrogen and hydrogen plasma, or an ammonia plasma, or an ammonia gas soak.

4. The method of claim 3, further comprising:

treating the feature with the nitrogen and hydrogen plasma or the ammonia plasma for a duration of greater than zero to approximately 60 sec or with the ammonia gas soak for a duration of greater than zero to approximately 240 seconds.

5. The method of claim 1, wherein the chlorine reduction process includes treating the titanium layer with a hydrogen soak process.

6. The method of claim 1, wherein the cobalt dewetting reduction process includes treating the feature with a silane gas soak.

7. The method of claim 1, further comprising:
performing a pre-clean process before depositing the titanium layer.

8. A non-transitory, computer readable medium having instructions stored thereon that, when executed, cause a method for forming a cobalt-titanium structure with a reduced contact resistance to be performed, the method comprising:
etching an opening into a substrate to form a feature with sidewalls and a bottom in the substrate, wherein the substrate is a silicon material with a layer of a dielectric material on an uppermost surface of the substrate and wherein the sidewalls are formed from the dielectric material and the bottom extends into the substrate and is formed into the silicon material;
depositing a titanium layer onto the feature using a plasma-enhanced chemical vapor deposition (PE-CVD) process in a PE-CVD titanium deposition chamber using titanium-chloride-based gas to form a titanium silicide layer directly on the bottom of the feature and to form a titanium silicon oxide first layer when the dielectric material is a silicon dioxide dielectric material or a titanium silicon nitride first layer when the dielectric material is a silicon nitride dielectric material directly on the sidewalls of the feature;
treating the feature with a nitridation process with a duration of approximately four minutes or less in the PE-CVD titanium deposition chamber to form a titanium silicon nitride second layer on the feature, wherein the titanium silicon nitride second layer prevents formation of silicon nitride on the titanium silicon oxide first layer or the titanium silicon nitride first layer which increases contact resistance and provides a barrier to eliminate formation of $TiSi_x$ on the titanium silicon oxide first layer or on the titanium silicon nitride first layer and subsequent intermixing with a first subsequent cobalt deposition layer;
treating the feature with a chlorine reduction process that reduces chlorine impurities caused by use of the titanium-chloride-based gas in depositing the titanium layer and promotes cobalt adhesion of the first subsequent cobalt deposition layer;
treating the feature with a cobalt dewetting reduction process that increases cobalt adhesion of the first subsequent cobalt deposition layer on the sidewalls of the feature;
depositing the first subsequent cobalt deposition layer directly on the bottom of the feature using a directional physical vapor deposition (PVD) process that prevents voids from forming in the bottom of the feature; and
depositing a second subsequent cobalt deposition layer directly on the first subsequent cobalt deposition layer using a CVD process to fill the feature to at least an uppermost surface of the substrate, wherein the feature forms a contact of cobalt and titanium-based material with a reduced contact resistance.

9. The non-transitory, computer readable medium of claim 8, further comprising:
reflowing the second subsequent cobalt deposition layer using a high temperature process.

10. The non-transitory, computer readable medium of claim 8, further comprising:
treating the feature with a silane gas soak as at least part of the cobalt dewetting reduction process; or
performing a pre-clean process before depositing the titanium layer.

11. The non-transitory, computer readable medium of claim 8, wherein the nitridation process is a nitrogen and hydrogen plasma, or an ammonia plasma, or an ammonia gas soak.

12. The non-transitory, computer readable medium of claim 11, further comprising:
treating the titanium silicon oxide first layer or the titanium silicon nitride first layer with the nitrogen and hydrogen plasma or the ammonia plasma for a duration of greater than zero to approximately 60 sec or with the ammonia gas soak for a duration of greater than zero to approximately 240 seconds as at least part of the nitridation process.

13. The non-transitory, computer readable medium of claim 8, wherein the chlorine reduction process includes treating the titanium silicon nitride second layer with a hydrogen soak process.

* * * * *